ized by examiner

(12) United States Patent
Hayashida

(10) Patent No.: US 7,643,896 B2
(45) Date of Patent: Jan. 5, 2010

(54) OPERATION-RELATED INFORMATION DISPLAY METHOD AND OPERATION-RELATED INFORMATION DISPLAY SYSTEM

(75) Inventor: Masataka Hayashida, Hadano (JP)

(73) Assignee: Ricoh Company, Ltd., Tokyo (JP)

( * ) Notice: Subject to any disclaimer, the term of this patent is extended or adjusted under 35 U.S.C. 154(b) by 572 days.

(21) Appl. No.: 11/146,092

(22) Filed: Jun. 7, 2005

(65) Prior Publication Data

US 2005/0273731 A1    Dec. 8, 2005

(30) Foreign Application Priority Data

Jun. 8, 2004 (JP) .............................. 2004-170308
Jan. 31, 2005 (JP) .............................. 2005-023595

(51) Int. Cl.
*G06F 19/00* (2006.01)
*G06F 17/50* (2006.01)

(52) U.S. Cl. ......................................... 700/97; 715/230
(58) Field of Classification Search .................. 700/86, 700/87, 97, 117–121; 703/1, 13–15; 706/919–921; 716/1, 4, 5, 9–11; 715/230–233
See application file for complete search history.

(56) References Cited

U.S. PATENT DOCUMENTS

| | | | | |
|---|---|---|---|---|
| 5,699,264 A | * | 12/1997 | Nakamura et al. ............. | 716/6 |
| 5,949,690 A | * | 9/1999 | Lawman ........................ | 716/6 |
| 6,240,541 B1 | * | 5/2001 | Yasuda et al. .................. | 716/6 |
| 6,516,452 B2 | * | 2/2003 | Meding ......................... | 716/5 |
| 6,519,603 B1 | * | 2/2003 | Bays et al. .................... | 707/102 |
| 6,643,836 B2 | * | 11/2003 | Wheeler et al. ............... | 716/11 |
| 6,684,379 B2 | * | 1/2004 | Skoll et al. ................... | 716/11 |
| 7,086,016 B2 | * | 8/2006 | Matsuzaki et al. ............ | 716/3 |
| 7,203,631 B2 | * | 4/2007 | Fraer et al. ................... | 703/14 |
| 7,272,812 B2 | * | 9/2007 | Ishiyama ...................... | 716/11 |
| 7,337,414 B2 | * | 2/2008 | Maruyama et al. ............ | 716/3 |
| 2004/0049747 A1 | * | 3/2004 | Yamasaki et al. ............. | 716/4 |
| 2005/0091626 A1 | * | 4/2005 | Okano et al. .................. | 716/11 |
| 2005/0251776 A1 | * | 11/2005 | Hsin et al. .................... | 716/11 |
| 2005/0268259 A1 | * | 12/2005 | Du ................................ | 716/5 |
| 2006/0282796 A1 | * | 12/2006 | Nuno et al. ................... | 715/853 |

FOREIGN PATENT DOCUMENTS

| | | |
|---|---|---|
| JP | 6-75046 | 10/1994 |
| JP | 2003-209392 | 7/2003 |
| JP | 2004-46636 | 2/2004 |
| JP | 2004-287609 | 10/2004 |

* cited by examiner

*Primary Examiner*—M. N. Von Buhr
(74) *Attorney, Agent, or Firm*—Oblon, Spivak, McClelland, Maier & Neustadt, L.L.P.

(57) ABSTRACT

An operation-related information display method includes storing information for identifying a printed-wiring board and information related to the printed-wiring board, identifying the printed-wiring board, obtaining information related to the printed-wiring board corresponding to the identified printed-wiring board, and when voluntary information is designated in the obtained information related to the printed-wiring board, displaying the designated information.

24 Claims, 10 Drawing Sheets

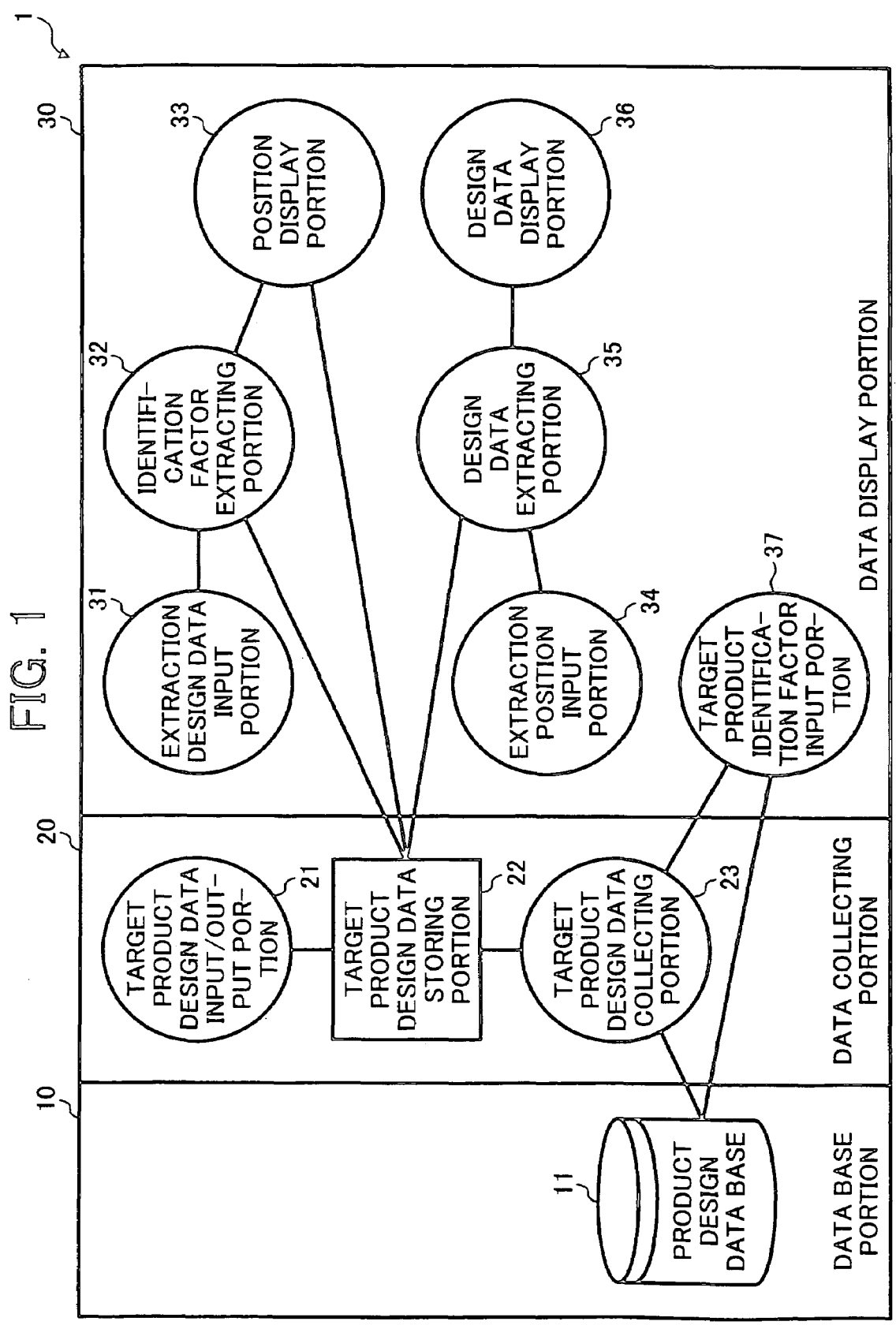

FIG. 2B

| PRODUCT IDENTIFICATION FACTOR | | NNNNN |
|---|---|---|
| LINE IDENTIFICATION FACTOR | | NNNNN |

| DISPLAY COMPONENT | DISPLAY (DESIGNATED) | BLACK |
| | DISPLAY (ALL) | NONE |
| DESIGNATION CONDITION | C | |
| DISPLAY PAD | DISPLAY (DESIGNATED) | RED |
| | DISPLAY (ALL) | GOLD |
| DESIGNATION CONDITION | B AND F | |

| | | |
|---|---|---|
| Ⓐ | COMPONENT NUMBER | 123456 |
| Ⓑ | REFERENCE NUMBER | IC1 |
| Ⓒ | ASSEMBLING METHOD | MOUNTER ① |
| Ⓓ | ... | ... |
| Ⓔ | ... | ... |
| Ⓕ | PIN NUMBER | 1 |
| ⊙ | ... | ... |

37 — PRODUCT IDENTIFICATION FACTOR
31 — DISPLAY COMPONENT

FIG. 3

| FIG. 3A |
|---|
| FIG. 3B |

FIG. 3A

| "INFORMATION FOR SPECIFYING A COMPONENT" | | "INFORMATION FOR SPECIFYING AN ASSEMBLING PART" | | |
|---|---|---|---|---|
| ASSEMBLING COMPONENT IDENTIFICATION FACTOR | ASSEMBLING COMPONENT FEATURE | ASSEMBLING PART IDENTIFICATION FACTOR | ASSEMBLING PART FEATURE | ASSEMBLING METHOD |
| AAAAA | W : 50 L : 70 | IC1 | θ : 90° | MOUNTER ① |
| BBBBB | W : 5 L : 10 | R1 | θ : 270° | MOUNTER ② |
| | | R2 | θ : 180° | HAND MOUNTING |
| | | C1 | θ : 0° | |

FIG. 3B

| ASSEMBLING INFORMATION | "INFORMATION FOR SPECIFYING A CONNECTING PART" | | | "INFORMATION FOR INDICATING A LAYOUT POSITION" | |
|---|---|---|---|---|---|
| | CONNECTING PART IDENTIFICATION FACTOR | CONNECTING PART FEATURE | INSPECTION METHOD | ASSEMBLING PART FEATURE | CONNECTING PART FEATURE |
| ○ | 1 | ☐ W:5 L:10 | VC | X:300 | X:330 Y:425 |
| | 2 | ☐ W:5 L:10 | VC | Y:400 | X:320 Y:425 |
| | 3 | ☐ W:5 L:10 | VC | | X:310 Y:425 |
| | 4 | ☐ W:5 L:10 | VC | | X:300 Y:425 |
| | 5 | ☐ W:5 L:10 | VC | | X:290 Y:425 |
| | 6 | ☐ W:5 L:10 | VC | | X:280 Y:425 |
| | 7 | ☐ W:5 L:10 | VC | | X:270 Y:425 |
| | 8 | ☐ W:5 L:10 | VC | | X:270 Y:375 |
| | 9 | ☐ W:5 L:10 | VC | | X:280 Y:375 |
| | 10 | ☐ W:5 L:10 | VC | | X:290 Y:375 |
| | 11 | ☐ W:5 L:10 | VC | | X:300 Y:375 |
| | 12 | ☐ W:5 L:10 | VC | | X:310 Y:375 |
| | 13 | ☐ W:5 L:10 | VC | | X:320 Y:375 |
| | 14 | ☐ W:5 L:10 | VC | | X:330 Y:375 |
| ○ | 1 | ☐ W:5 L:5 | VC | X:500 | X:505 Y:600 |
| | 2 | ☐ W:5 L:5 | VC | Y:600 | X:495 Y:600 |
| ○ | 1 | ☐ W:5 L:5 | VISUAL INSPECTION | X:600 | X:600 Y:705 |
| | 2 | ☐ W:5 L:5 | VISUAL INSPECTION | Y:700 | X:600 Y:695 |
| × | 1 | ☐ W:5 L:5 | | X:700 | X:700 Y:795 |
| | 2 | ☐ W:5 L:5 | | Y:800 | X:700 Y:805 |

| FIG. 5A |
| FIG. 5B |

FIG. 5B

| | PRODUCT IDENTIFICATION FACTOR | NNNNN | |
|---|---|---|---|
| | LINE IDENTIFICATION FACTOR | NNNNN | |
| (A) | DISPLAY COMPONENT | DISPLAY (DESIGNATED) | BLACK |
| | | DISPLAY (ALL) | |
| | DESIGNATION CONDITION | A OR B | |
| (B) | DISPLAY PAD | DISPLAY (DESIGNATED) | RED |
| | | DISPLAY (ALL) | GOLD |
| | DESIGNATION CONDITION | B OR F | |
| (C) | COMPONENT NUMBER | 234567 | |
| (D) | REFERENCE NUMBER | IC1 | |
| (E) | ASSEMBLING METHOD | MOUNTER ① | |
| | ... | ... | |
| | ... | ... | |
| (F) | PIN NUMBER | 1 | |
| (·) | ... | ... | |

| FIG. 6A |
| FIG. 6B |

FIG. 6B

| | | | |
|---|---|---|---|
| PRODUCT IDENTIFICATION FACTOR | | NNNNN | |
| LINE IDENTIFICATION FACTOR | | NNNNN | |
| DISPLAY COMPONENT | DISPLAY (DESIGNATED) | BLACK | |
| | DISPLAY (ALL) | NONE | |
| DESIGNATION CONDITION | C | | |
| DISPLAY PAD | DISPLAY (DESIGNATED) | RED | |
| | DISPLAY (ALL) | GOLD | |
| DESIGNATION CONDITION | B AND F | | |
| (A) COMPONENT NUMBER | 123456 | | |
| (B) REFERENCE NUMBER | IC1 | | |
| (C) ASSEMBLING METHOD | MOUNTER ① | | |
| (D) | ... | | |
| (E) | ... | | |
| (F) PIN NUMBER | 1 | | |
| (-) | ... | | |

OPERATION-RELATED INFORMATION DISPLAY METHOD AND OPERATION-RELATED INFORMATION DISPLAY SYSTEM

BACKGROUND OF THE INVENTION

1. Field of the Invention

The present invention relates to an operation-related information display method, operation-related information display system, printed-wiring board operation-related information display system, printed-wiring board operation-related information display method, printed circuit assembly manufacturing method using the display method, computer program for running the display method and recording medium capable of recording the computer program. Particularly, the present invention relates to an operation-related information display method, operation-related information display system, printed-wiring board operation-related information display system, printed-wiring board operation-related information display method, printed circuit assembly manufacturing method using the display method, computer program for running the display method for displaying a working such as an assembling, confirming, exchanging or correcting of a component to a printed-wiring board in operations such as assembly, inspection and repair of a printed-circuit assembly and recording medium capable of recording the computer program.

2. Related Art Statement

With downsized electronic devices, a printed-wiring board has increasingly been complicated, downsized and become high density, so that a space for printing a reference number for identifying a component to be mounted onto the printed-wiring board has gradually reduced.

Therefore, it is increasingly difficult to find a position of component to be mounted and a position of mounted component by reasons that a component to be mounted is separated from a printed position of a reference number, a printed character of a reference number is small and a reference number is not printed. Accordingly, there were problems with generating a miss-operation, operation inability and a long operation time in operations such as assembly, inspection and repair of a printed-circuit assembly.

Conventionally, there has been proposed with a process mounting information composing device including storing means for storing process information for instructing a process that each electronic component is mounted on a substrate for a plurality of electronic components, display means for displaying a mounted development of the electronic components and drawing means for drawing the electronic component onto the display means. When a voluntary process is designated, the drawing means draws an electronic component to be mounted in the designated process by a predetermined drawing state and draws an electronic component to be mounted in a process other than the above process by a drawing state different from the above drawing state (reference to Published Utility Model Application H06-75046).

More particularly, in the related art, a worker can easily recognize an appropriate position and appropriate component onto a substrate in each process.

In addition, conventionally, there has been proposed with a component mounting instructing device having a function for illustrating a position of electronic component to be mounted together with a position of electronic component to be mounted on the periphery with mounting order in the component mounting instructing device to instruct an electronic component to be mounted when mounting an electronic component onto a component mounting member such as a high density substrate and a printed substrate without silk display (reference to Japanese Patent Laid-Open 2003-209392).

The related art illustrates a position of an electronic component to be mounted together with a position of electronic component to be mounted onto the periphery when mounting an electronic component onto a printed-wiring board to improve mounting efficiency.

However, in the above related arts, it was necessary to modify the above devices in order to improve workability such as assembly, inspection and repair of a component of a printed-wiring board.

More particularly, in the related art set forth in Published Utility Model Application H06-75046, a worker can easily recognize an appropriate position and an appropriate component on a substrate in each process, so that a position is displayed with respect to an electronic component to be mounted in a designated process, but a position is not displayed with respect to a voluntary designated component. Therefore, there was a problem with poor workability.

In addition, in the related art set forth in Japanese Patent Laid-Open 2003-209392, a position of an electronic component to be mounted is displayed in mounting order by a relationship with periphery components, but a voluntary designated component could not be displayed. Therefore, there was a problem with poor workability.

SUMMARY OF THE INVENTION

It is, therefore, an object of the present invention to provide an operation-related information display method which clearly identifies a working position in operations including assembly, inspection and repair of a printed-circuit assembly, prevents generations of miss-operation and operation inability state, reduces a time for finding a working position, decreases a working time and improves workability.

In order to achieve the above object, an operation-related information display method in one embodiment of the present invention comprises the steps of storing information for identifying a printed-wiring board and information related to the printed-wiring board, identifying the printed-wiring board, obtaining information related to the printed-wiring board corresponding to the identified printed-wiring board, and when voluntary information is designated in the obtained information related to the printed-wiring board, displaying the designated information.

According to an operation-related information display method in one embodiment of the present invention, a working position can be clearly defined in operations of assembly, inspection and repair of a printed-circuit assembly and generations of miss-operation and operation inability state can be prevented, in addition, a working time can be decreased by reducing a time for finding a working position and workability can be improved.

PRIORITY CLAIM

This application claims the benefit of priority to Japanese Patent Application No. 2004-170308 filed on Jun. 8, 2004 and Japanese Patent Application No. 2005-023595 filed on Jan. 31, 2005, which are hereby incorporated by reference.

BRIEF DESCRIPTION OF THE DRAWINGS

FIG. 1 is a block diagram of an operation-related information display system in which one embodiment of an operation-related information display method and operation-related information display system of the present invention is applied.

FIG. 3, which includes FIGS. 3A and 3B, is a view illustrating an example of the contents stored in the target product design data storing portion in FIG. 1.

FIG. 5, which includes FIGS. 5A and 5B, is a view showing a display example of the data display portion in the position display process of the operation-related information display process in FIG. 4.

FIG. 6, which includes FIGS. 6A and 6B, is a view showing a display example of a data display portion in the design data display process of the operation-related information display process in FIG. 4.

DETAILED DESCRIPTION OF THE PREFERRED EMBODIMENT

Figures 2, 2A, 2B:
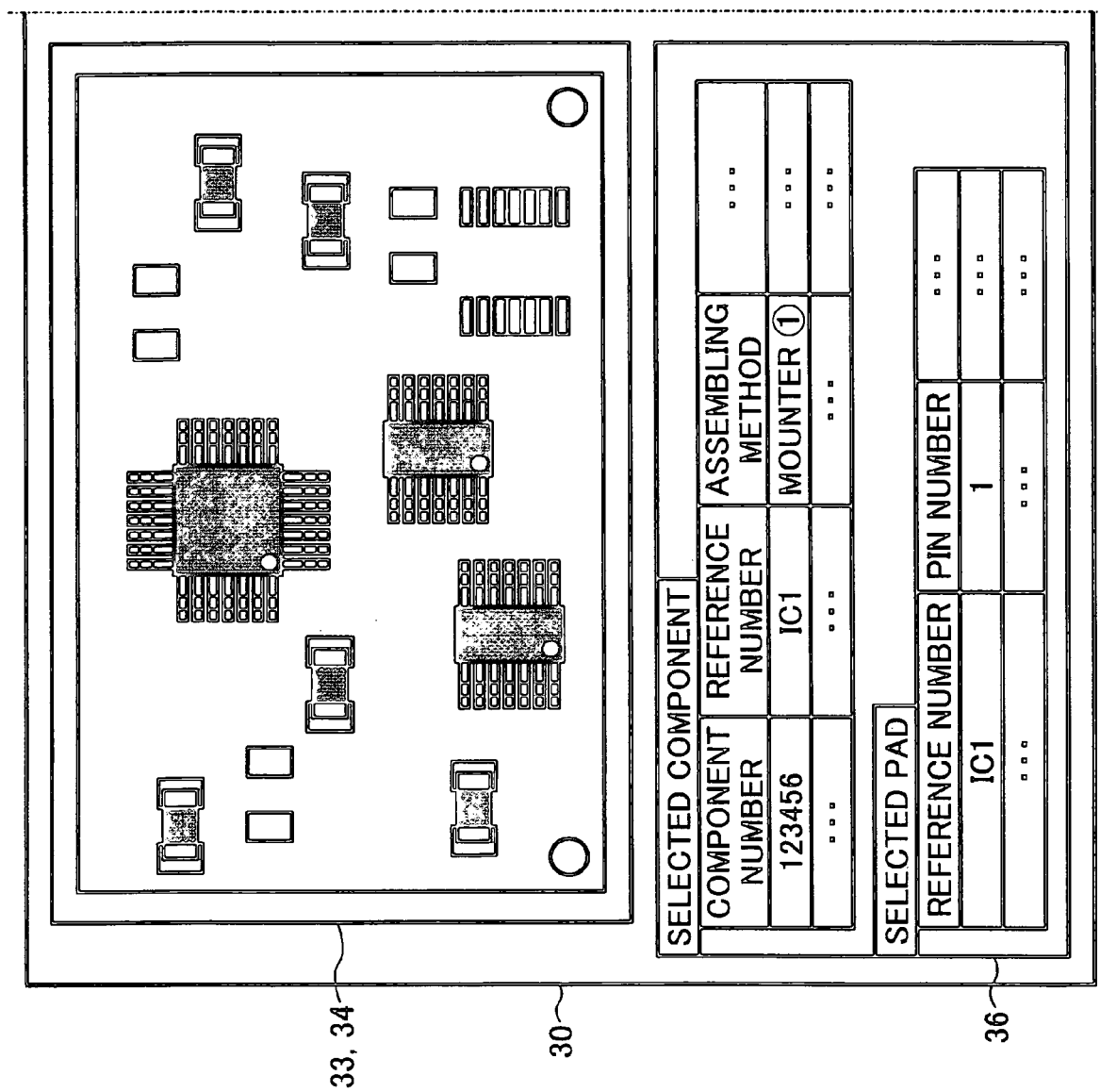
FIG. 2, which includes
FIGS. 2A and 2B, is a plan view of one example of the data display portion in FIG. 1.

Hereinafter, a preferred embodiment of the present invention will be explained in detail based on the accompanying drawings. The following embodiment is a preferred embodiment of the present invention, so that technically preferred various limitations are applied thereto. However, the scope of the invention is not limited to the embodiment unless a description particularly limiting the present invention is included in the following description.

FIGS. 1 to 6 are views illustrating an embodiment of an operation-related information display method and an operation-related information display system of the present invention. FIG. 1 is a block diagram showing an operation-related information display system 1 in which one embodiment of the operation-related information display method and the operation-related information display system of the present invention is applied.

In FIG. 1, the operation-related information display system 1 comprises a data base portion 1 for storing design data of a product, a data collecting portion 20 for collecting target product data from the design data of the data base portion 10 and a data display portion 30 for displaying different types of information.

A product design data base 11 is stored in the data base portion (data base device) 10. Assembling part design data, assembling component design data and connecting part design data of a component for assembling to a printed-wiring board are registered in the product design data base 11.

The data collecting portion (data collecting device) 20 comprises an target product design data input/output potion (target product design data input/output device) 21 for inputting and outputting design data of an target product, an target product design data storing portion 22 for storing design data, and an target product design data collecting portion (target product design data collecting device) 23 for collecting design data.

The data display portion (data display device) 30 comprises an extraction design data input portion (extraction design data input device) 31 as a first information designation device capable of inputting voluntary "information for specifying a component", "information for specifying an assembling part", "information for specifying a connecting part" or a combination of at least two information of these information (hereinafter referred to as "combination information"), an identification factor extracting portion (identification factor extracting device) 32 for extracting an identification factor corresponding to the information input from the extraction design data input portion 31, a position display portion (position display device) 33 for displaying all components and connecting parts on a layout of a printed-wiring board in distinction between the component and connecting part corresponding to the identification factor extracted by the identification factor extracting portion 32 and other components and connecting parts, an extraction position input portion (extraction position input device) 34 as a second information designation device capable of inputting a voluntary position, a design data extracting portion (design data extracting device) 35 for extracting "information for specifying a component", "information for specifying an assembling part" or "information for specifying a connecting part" corresponding to the position input by the extraction position input portion 34, a design data display portion (design data display device) 36 for displaying the information extracted by the design data extracting portion 35 and an target product identification factor input portion 37 as a third information designation device capable of inputting a product identification factor and a line identification factor of an target product.

In addition, the data display portion 30 includes a ROM (not shown) in which a program for controlling the above described each portion, a RAM (not shown) for temporarily storing a parameter for an operation, and a CPU (not shown) for controlling each portion in the operation-related information display system 1 in accordance with the program stored in the ROM. In the present embodiment, a system having a CPU, ROM, and RAM in the data display portion 30 is described. However, the present invention is not limited thereto, and a system having a CPU, ROM and RAM in each of the data collecting portion 20 and the data base portion 10 can be used, or a system having CPU, ROM and RAM in any one of the data collecting portion 20 and the data base portion 10 can be used. Moreover, the data base portion 10, data collecting portion 20 and data display portion 30 may be independently structured or may be integrally structured in the operation-related information system 1. It is also possible to separately structure only the data base portion 10 from the data collecting portion 20 and the data display portion 30.

In the data display portion 30, if voluntary "information for specifying a component", "information for specifying an assembling part", "information for specifying a connecting part" or a combination of these information ("combination information") is input from the extraction design data input portion 31, the identification factor extracting portion 32 extracts the identification factor corresponding to the input information from the data of the data collecting portion 20, and the position display portion 33 displays all components and connecting parts on the layout of the printed-wiring board in distinction between the component and connecting part corresponding to the identification factor extracted by the identification factor extracting portion 32 and other components and connecting parts. In the data display part 30, when a voluntarily position is input on the layout of the printed-wiring board from the extraction position input portion 34, the design data extracting portion 35 extracts "information for specifying a component" of the component existing in the input position, "information for specifying an assembling part" of the assembling part existing in the input position or "information for specifying a connecting portion" of the connecting portion existing in the designated position based on the input from the extraction position input portion 34, and the design data display portion 36 displays the extracted information.

As shown in FIG. 2, the data display portion 30 is provided with the extraction design data input portion 31 on the right side of the screen, and the target product identification factor input portion 37 on the upper side, for example. In addition, the data display portion 30 is provided with the position display portion 33 and the extraction position input portion 34 using a common screen on the left side of the screen. In FIG. 2, the position display portion 33, the extraction position input portion 34 and the design data display portion 36 can be provided in a common screen, and extracted information can be displayed on the layout of the printed-wiring board in FIG. 2.

Here, "information for specifying a component" means combination information such as an assembling component identification factor and an assembling component feature, and "information for specifying an assembling part" means combination information such as an assembling part identification factor, an assembling part feature and an assembling method. In addition, "information for specifying a connecting part" means combination information such as a connecting part identification factor, a connecting part feature and an inspection method, and "information for indicating a layout position" means combination information such as a mounting plane, mounting coordinates and center coordinates. Furthermore, "product identification factor" means a printed-wiring board's number, a printed-wiring board's name and the like, and "line identification factor" means a line's number, a line's name and the like. In addition, "assembling component identification factor" means a mounted component's number, product name, maker, maker's model number, and "mounting component feature" means combination such as a brief shape (QFP, SOP, CHIP, etc.), a brief shape of pin (flat, gall-wing, J-lead, etc.), the number of pin, length, width, height, pitch, material, mark, polarity, type of packing (embossed tape, tray, stick, etc.), packing size, packing angle and the like. Furthermore, "assembling part identification factor" means a reference number (address), etc., and "assembling part feature" means a mounting angle, etc. Moreover, "mounting method" means a combination such as a mounting method, mounting process (equipment, worker, etc.), and "connecting part identification factor" means a pin number and the like. Furthermore, "connecting part feature" mans a combination such as shape and size of pad, shape and size of resist, shape and size of solder printing mask opening and the like, and "inspection method" means an inspection method (such as an appearance inspection machine, incirciut and tester, function and tester, and visual inspection), etc. Moreover, "feature" means a combination such as a structural feature, material feature and characteristic, and "structural feature means a combination of condition such as a shape, size, angle weight and disposition. Furthermore, "material feature" means a combination of condition such as a material and surface treatment, and "characteristic" means a combination of condition such as a type and packing.

Next, each of the above data base portion 10, data collecting portion 20, and data display portion 30 will be described in detail.

The assembling part design data represented by a product identification factor, line identification factor, assembling part identification factor, assembling part identification factor, assembling part feature and assembling method, the assembling component design data represented by an assembling component identification factors and assembling component feature, and the connecting part design data represented by a product identification factor, assembling part identification factor, connecting part identification factor, connecting part feature and inspection method are registered in the product design data base 11 of the data base portion 10.

Moreover, the target product design data collecting portion 23 of the data collecting portion 20 collects the target product assembling part design data of the assembling part design data corresponding to the product identification factor and line identification factor input by the target product identification factor input portion 37 of the data display portion 30, the target product assembling component design data of the assembling component design data corresponding to the assembling component identification factor in the target product assembling part design data and the target product connecting part design data of the connecting part design data corresponding to the product identification factor input by the target product identification factor input portion 37 from the product design data base 11. The target product design data collecting portion 23 compares the target product assembling part design data with the assembling component identification factor of the target product assembling component design data, relates the target product assembling component design data to the target product assembling part design data to obtain correspondence data A. In addition, the target product design data collecting portion 23 compares the correspondence data A with the assembling part identification factor of the target product connecting part design data, and relates the target product connecting part design data to the correspondence data A to obtain the correspondence data B, and then stores the correspondence data B in the target product design data storing portion 22. The correspondence data A is represented by a product identification factor, line identification factor, assembling part identification factor, assembling part feature, assembling method and assembling component feature. The correspondence data B is represented by a product identification factor, line identification factor, assembling part identification factor, assembling part feature, assembling method, assembling component feature, connecting part identification factor, connecting part feature and inspection method.

The target product design data storing portion 22 stores a product identification factor, line identification factor, assembling part identification factor, assembling part feature, assembling method, assembling component feature, connecting part identification factor, connecting part feature, inspection method and target product design data displayed by with or without installation.

One example of the contents stored in the target product design data storing portion 22 is indicated as illustrated in FIG. 3. The target product design data storing portion 22 stores assembling status information for indicating whether a component is assembled or not in the target product design data in which "information for specifying a component" of components comprising a printed-wiring board, "information for specifying an assembling part" of a printed-wiring board and "information for specifying a connecting part" of a printed-wiring board are compared with "information for indicating a layout position" of a printed-wiring board.

The target product design data input/output portion 21 is used for inputting, editing and outputting the data stored in the target product design data storing portion 22.

The target product identification factor input portion 37 is used for selecting and inputting the product and line identification factors of the target product collecting the data by the target product design data collecting portion 23 from the product and line identification factors stored in the product design data base 11, and the input of the target product identification factor input portion 37 can be performed by any of voluntary input, area input divided a certain area and unspecific input.

The extraction design data input portion 31 is used for selecting and inputting "information for specifying a component", "information for specifying an assembling part", "information for specifying a connecting part" or "combination information" stored in the target product design data storing portion 22. The input of the extraction design data input portion 31 can be performed by any of voluntary input, area input divided a certain area and unspecific input.

The identification factor extracting portion 32 extracts the assembling part identification factor and connecting part identification factor corresponding to "information for specifying a component", "information for specifying an assembling part", "information for specifying a connecting part" or a combination of these information ("combination information") input by the extraction design data input portion 31 from the target product design data storing portion 22. While the assembling status is input to the target product design data storing portion 22, the identification factor extracting portion 32 extracts the assembling part identification factor of the component if the component corresponding to "information for specifying a component", "information for specifying an assembling part", "information for specifying a connecting part" or combination of these information ("combination information") input by the extraction design data input portion 31 is assembled, and extracts the connecting part identification factor of the component if the corresponding component is not assembled.

The position display portion 33 distinguishes the component and connecting part corresponding to the identification factor extracted by the identification factor extracting portion 32 from other components and connecting parts, and displays all components and connecting parts on the layout of the printed-wiring board by using the data stored in the target product design data storing portion 22.

The extraction position input portion 34 is used for selecting and inputting voluntary position on the layout of the printed-wiring board displayed on the position display portion 33, and this input may be area input divided a certain area.

The design data extracting portion 35 extracts "information for specifying a component" of the component existing in the position input by the extraction position input portion 34, "information for specifying an assembling part" of the assembling part existing in the position input by the extraction position input portion 34 or "information for specifying a connecting part" of the connecting part existing in the position input by the extraction position input portion 34 from the target product design data storing portion 22.

The design data display portion 36 displays "information for specifying a component", "information for specifying an assembling part" or "information for specifying a connecting part" extracted by the design data extracting portion 35. In addition, "printed circuit assembly" means a printed-wiring board on which components are mounted.

Next, functions of the present invention will be described. Generally, in operations of assembling, inspection and repairing, voluntary "information for specifying a component", "information for specifying an assembling part", "information for specifying a connecting part" or "combination information" of these information is designated to find the position corresponding to the designated information on the layout of the printed-wiring board, and the operation designated in a position is performed. Moreover, in an inspection operation, the position having defect is found, and "information for specifying a component" of the component existing in the position, "information for specifying an assembling part" of the assembling part existing in the position or "information for specifying a connecting part" of the connecting part existing in the position is extracted to record the information, and the mounted component is compared with the information to see whether the component is correctly mounted or not.

The operation-related information display system 1 of the present embodiment stores (prepare) the target product design data in which "information for specifying a component" of a component constructing a printed-wiring board, "information for specifying an assembling part" of a printed-wiring board and "information for specifying a connecting part" of a printed-wiring board are compared with "information for indicating a layout position". When voluntary "information for specifying a component", "information for specifying an assembling part", "information for specifying a connecting part" or "combination information" of the these information is designated, the operation-related information display system 1 displays all components and connecting parts on the layout of the printed-wiring board with the state that the component and connecting part corresponding to the designated information is distinguished from other components and connecting parts. Moreover, when a voluntary position is designated on the layout of the printed-wiring board, the operation-related information display system 1 displays "information for specifying a component" of the component existing in the designated position, "information for specifying an assembling part" of the assembling part existing in the designated position or "information for specifying a connecting part" of the connecting part existing in the designated portion. As described above, the operation-related information display system 1 can clearly define "information for specifying a component" of the component to be worked and the position to be worked, "information for specifying an assembling part" of the assembling part to be worked or "information for specifying a connecting part" of the connecting part to be worked in the operations of assembling, inspection and repairing of a printed-wiring board. Therefore a miss-operation can be prevented, and operation inability is also solved. In addition, the operation-related information display system 1 can reduce a time for finding a position to be worked and a time for searching "information for specifying a component" of the component to be worked, "information for specifying an assembling part" of the assembling part to be worked, or "information for specifying a connecting part" of the connecting part to be worked. Accordingly, a working time is reduced and workability is improved.

More particularly, a worker operates the data display portion 30 in the operation-related information display system 1 or the system 1 provided in a working table to display the layout of the printed-wiring board corresponding to the printed-wiring board in which the operations such as assembling, inspection and repairing are actually performed on the working table, etc. When the worker designates voluntary information in the information contained in "information for specifying a component", "information for specifying an assembling part" and "information for specifying a connecting part", an intuitively recognizable display corresponding to the information (for example, shape of component, shape of connecting part of component) is displayed on the layout of the printed-wiring board displayed on the data display portion 30. In this case, other components are displayed on the layout of the printed-wiring board (the display of other components can be omitted in view of the viewablity of the worker). When other components are displayed, the display corresponding to the information designated by the worker is displayed with a state that the display corresponding to the designated information is distinguished from the displays of other components. For instance, red is used for the display corresponding to the information designated by the worker, and black is used for the display related to other components. Moreover, a solid line can be used for the display corresponding to the information designated by the worker, and a dotted line can be used for the display related to other components. Furthermore, the wiring on the layout of the printed-wiring board may be displayed or may not be displayed. More particularly, a layout is displayed as clearly recognizable as possible and as viewable as possible such that the worker can perform an operation without making a mistake. On the other hand, when the worker designates a voluntary position on the layout of the printed-wiring board displayed on the data display portion 30, the information contained in "information for specifying a component", "information for specifying an assembling part" and "information for specifying a connecting part." to be disposed in the position can be displayed on the data display portion 30.

Figure 4:
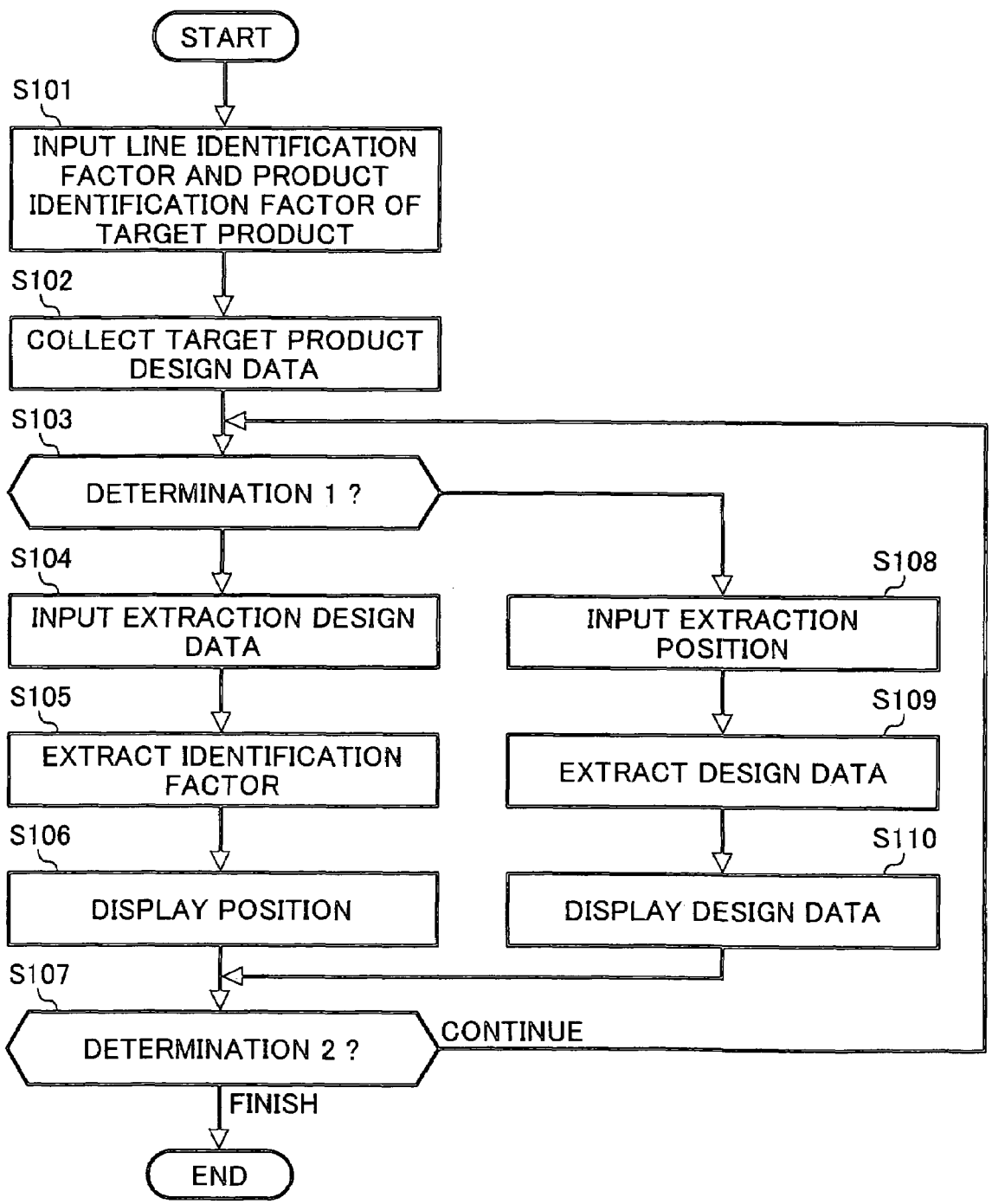
FIG. 4 is a flow chart illustrating the operation-related information display process by the operation-related information display system in FIG. 1.

The flow chart shown in FIG. 4 illustrates a control to be conducted by a CPU (not shown) in accordance with a program stored in a ROM (not shown) in the data display portion 30 of the operation-related information display system 1. In addition, the program is not limited to the program stored in the ROM, it can be a program to be loaded in a RAM from a recording medium such as a hard disk when the power source of the operation-related information display system 1 is turned on or the execution of the program is selected by the worker. In other word, the program can be a program recorded in a hard disk or CD-ROM, and also can be a program to be downloaded into the operation-related information display system 1 through a network such as the internet.

The data base portion 10 of the operation-related information display system 1 is previously prepared, and the assembling part design data, assembling part design data and connecting part design data of components for a newly maintained printed-wiring board is always registered. With this state, as shown in FIG. 4, the product identification factor and line identification factor stored in the product design data base 11 is selected and input, or voluntary input from the target product identification input portion 37 (step S1). In the operation-related information display system 1, the target product design data collecting portion 23 collects the assembling part design data, assembling component design data and connecting part design data corresponding to the identification factor input by the step S101 from the product design data base 11 to perform the correspondence, and stores in the target product design data storing portion 22 (step S102). Moreover, in this case, the worker can input, edit and output the data stored in the target product design data storing portion 22 by using the target product design data input/output portion 21.

In the data display portion 30, the display shown in FIG. 2 is performed. The CPU conducts a determination 1 whether or not voluntary "information for specifying a component", "information for specifying an assembling part", "information for specifying a connecting part" or "combination information" is selected and input through the extraction design data input portion 31 by the worker, or whether or not a voluntary position on the layout of the printed-wiring board is input through the extraction position input portion 34 by the worker (step S103). When the CPU determines that various information is selected and input from the extraction design data input portion 31, in accordance with the select and input of "information for specifying a component", "information for specifying an assembling part", "information for specifying a connecting part" or "combination information" through the extraction design data input portion 31, or the voluntary input of these (step S104), the CPU of the data display portion 30 makes the identification factor extracting portion 32 to extract the assembling part identification factor and connecting part identification factor corresponding to "information for specifying a component", "information for specifying an assembling part", "information for specifying a connecting part" or "combination information" input by the step S104 from the target product design data storing portion 22 (step S105). In this case, while the assembling information is input to the target product design data storing portion 22, the CPU commands the identification factor extracting portion 32 to extract the assembling part identification factor of the component when the component corresponding to "information for specifying a component", information for specifying an assembling part", "information for specifying a connecting part" or "combination information" is assembled, or to extract the connecting part identification factor of the component when the component is not assembled.

Figures 5, 5A:
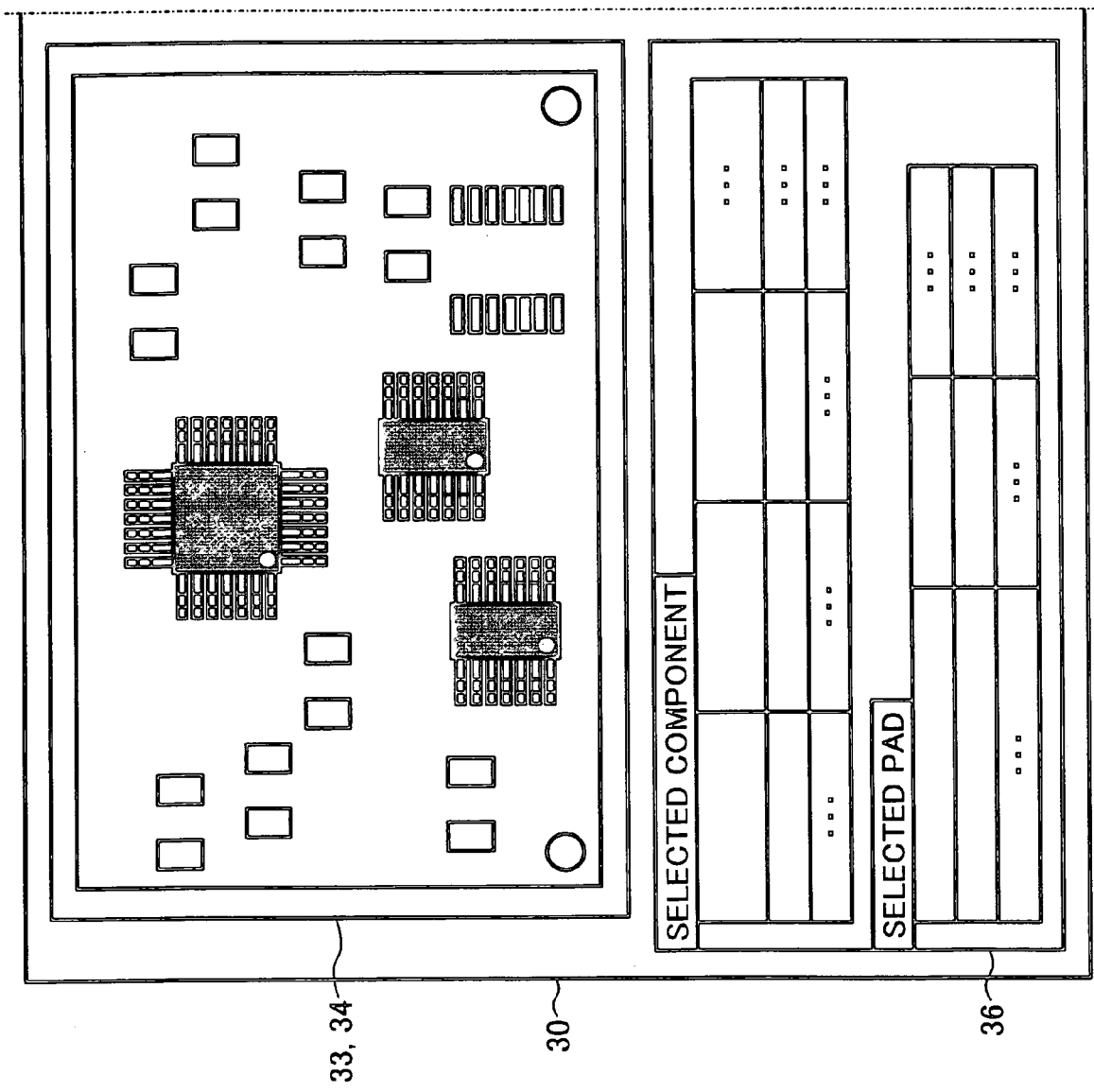

Next, the CPU distinguishes the component and connecting part corresponding to the identification factor extracted by the identification factor extracting portion 32 in the step S105 from other components and connecting parts, and makes the position display portion 22 to display a position as shown in FIG. 5 on the layout of the printed-wiring board on the data display portion 30 by using data stored in the target product design data storing portion 22 (step S106). More particular, the component and connecting part corresponding to the identification factor is displayed by red of the intuitively recognizable display, and other components and connecting parts are displayed by black of the intuitively recognizable display. In addition, the component and connecting part corresponding to the identification factor may be displayed by a solid line, and other components and connected parts may be displayed by dotted lines.

When the positional display is performed, the CPU determines whether or not the process is continued in accordance with the input by the worker (step S107). When the process is continued, the CPU goes back to the step S103 to carry out the process similar to the above processes from the determination 1.

When the CPU determines a voluntary position is input by the worker on the layout of the printed-wiring board though the extraction position input portion 34 without selecting and inputting various information through the extraction design data input portion 31 in the determination 1 of the step S103, in accordance with a voluntary position or area (range) (reference to the dotted line in FIG. 6) to be selected and input on the layout of the printed-wiring board through the extraction position input portion 34 (step S108), the CPU of the data display portion 30 makes the design data extracting portion 35 to extract "information for specifying a component" of the component existing in the input position, "information for specifying an assembling part" of the assembling part existing in the input position or "information for specifying a connecting part" of the connecting part existing in the input position based on the position input by the step S108 from the target product design data storing portion 22 (step S109).

Figures 6, 6A:
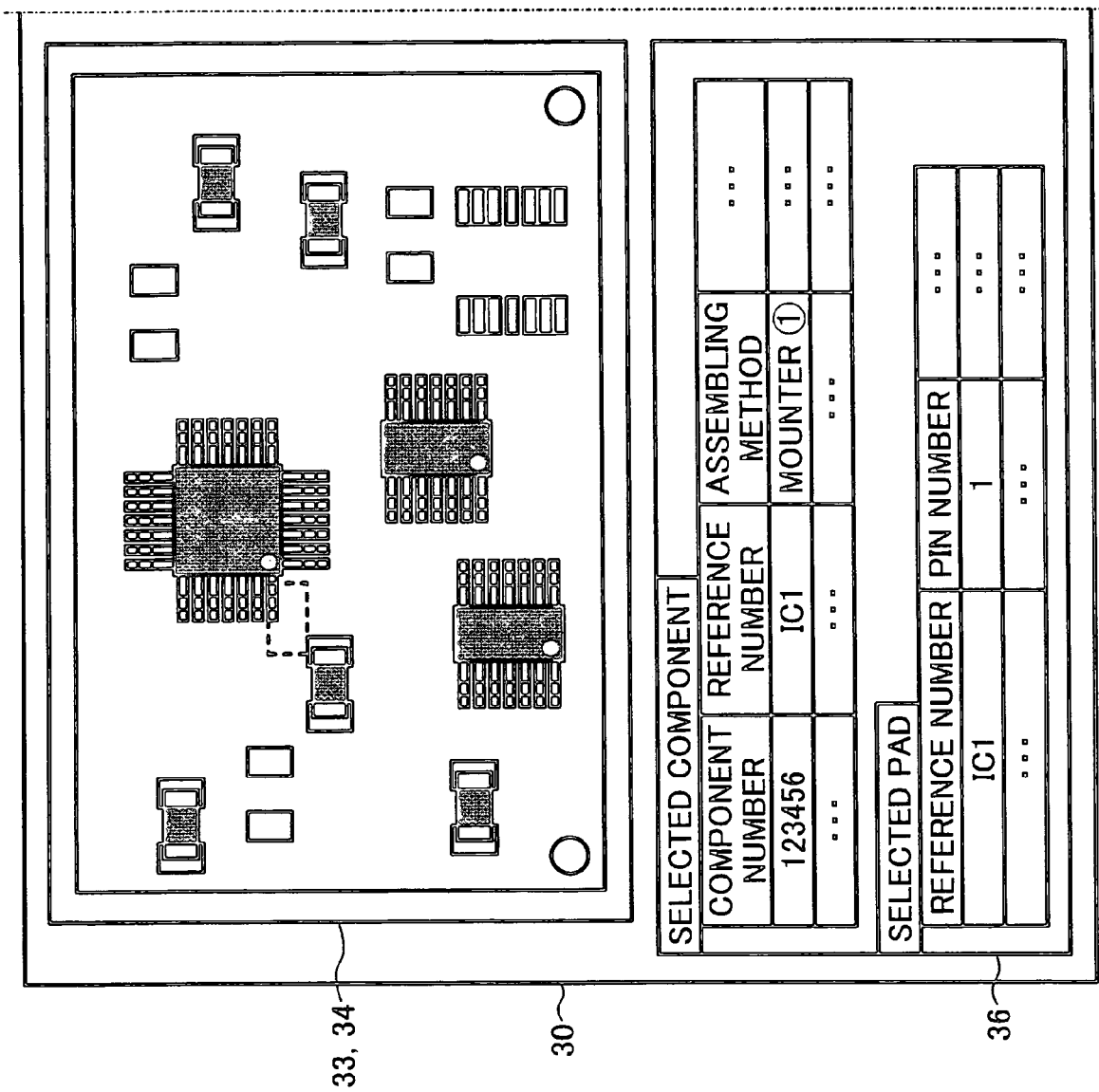

Next, the CPU displays the design data such as "information for specifying a component", "information for specifying an assembling part" or "information for specifying a connecting part" extracted by the design data extracting portion 35 in step S109 on the design data display portion 36 of the data display portion 30 as shown in FIG. 6 (step S110).

After the intuitively recognizable position display on the layout of the printed-wiring board corresponding to the component information designated by the worker, the design data display corresponding to the position or the area voluntary designated by the worker on the layout of the printed-wiring board have been performed, the CPU of the operation-related information display system 1 (data display portion 30) determines whether or not the process is continued in accordance with the input of the worker (step S107). When the process is continued, the CPU goes back to the step S103, and conducts the process similar to the above processes from the determination 1 (step S110).

When the process is not continued in step S107, the operation-related information display system 1 completes the operation-related information display process.

The operation-related information display system 1 can display printed-wiring board operation-related information by the method described above. Moreover, the components are mounted on the printed-wiring board, or the inspection such as assembling the component is performed, and the printed circuit assembly is manufactured by the above processes (steps).

As described above, in the operation-related information display system 1 of the present embodiment, the data collecting portion 20 collects the target product design data in which the "information for specifying a component" of the component constructing the printed-wiring board and "information for specifying an assembling part" of the printed-wiring board are compared with "information for indicating a layout position" of the printed wiring board from the design data of the printed-wiring board stored in the data base portion 10, the identification factor extracting portion 32 of the data display portion 30 extracts the assembling part identification factor corresponding to the input information from the target product design data collected by the data collecting portion 20 when voluntary "information for specifying a component", "information for specifying an assembling part" or "combination information" of these information is input from the extraction design data input portion 31 of the data display portion 30 displaying all components on the layout of the printed-wiring board, and the position display portion 33 of the data display portion 30 displays all components on the layout of the printed-wiring board with the state that the component corresponding to the extracted identification factor is discriminated from other components.

Accordingly, a working position in assembling, inspection and repairing of a printed-wiring board can be clearly defined by displaying all components on the layout of the printed-wiring board in distinction between the component corresponding to the designated information and other components. Therefore, generations of miss-operation and operation inability state can be prevented. In addition, a working time can be reduced by shortening a time for finding a working position; thus, workability can be improved.

According to the operation-related information display system 1 of the present embodiment, the data colleting portion 20 collects the target product design data in which "information for specifying a component" of the component constructing the printed-wiring board and "information for specifying an assembling part" of a printed-wiring board are compared with "information for indicating a layout position" of the printed wiring-board from the design data of the printed-wiring board stored in the data base portion 10, and the design data extracting portion 35 of the data display portion 30 extracts "information for specifying a component" of the component existing in the input position or "information for specifying an assembling part" of the assembling part existing in the input position from the target product design data collected by the data collecting portion 20 when a voluntary position is input on the layout of the printed-wiring board from the extraction position input portion 34 of the data display portion 30 displaying the extraction information on the layout of the printed-wiring board, and the design data display portion 36 of the data display portion 30 displays the extracted information.

Accordingly, "information for specifying a component" of the component to be worked and "information for specifying an assembling part" of the assembling part to be worked can be clearly defined in an inspection of a printed-wiring board, so that generations of miss-operation and operation inability state can be prevented. In addition, a working time can be reduced by shortening a time for finding "information for specifying a component" of the component to be worked and "information for specifying an assembling part" of the installing part to be worked; thus, workability can be improved.

Moreover, in the operation-related information display system 1 of the present embodiment, the data collecting portion 20 collects the target product design data in which "information for specifying the component" of a component constructing the printed-wiring board, "information for specifying an assembling part" of the printed-wiring board and "information for specifying a connecting part" of the printed-wiring board are compared with "information for indicating a layout position" from the design data of the printed wiring board stored in the data base portion 10, and the identification factor extracting portion 32 of the data display portion 30 extracts the assembling part identification factor and connecting part identification factor corresponding to the information input by the extraction design data input portion 31 from the target product design data collected by the data collecting portion 20 when voluntary "information for specifying a component", "information for specifying an assembling part", "information for specifying a connecting part" or "combination information" of these information is input from the extraction design data input portion 31 of the data display portion 30 displaying all connecting parts on the layout of the printed-wiring board, and the position display portion 33 of the data display portion 30 displays all connecting parts on the layout of the printed-wiring board with the state that the connecting part corresponding to the identification factor extracted by the identification factor extracting portion 32 is discriminated from other connecting parts.

Therefore, a working position can be further defined in operations of assembling, inspection and repairing of a printed-wiring board, so that generations of miss-operation and operation inability state can be further prevented. In addition, a working time can be further reduced by further shortening a time for finding a working position; thus, workability can be further improved.

In addition, in the operation-related information display system 1 of the present embodiment, the data collecting portion 20 collects the target product design data in which "information for specifying a component" of the component constructing the printed-wiring board, "information for specifying an assembling part" of the printed-wiring board and "information for specifying a connecting portion" of the printed wiring-board are compared with "information for indicating a layout position" of the printed-wiring board from the design data of the printed-wiring board stored in the data base portion 10, the design data extracting portion 35 of the data display portion 30 extracts "information for specifying a component" of the component existing in the input position, "information for specifying an assembling part" of the assembling part existing in the input position or "information for specifying a connecting part" of the connecting part existing in the input position from the target product design data collected by the data collecting portion 20 when a voluntary position is input on the layout of the printed-wiring board from the extraction position input portion 34 of the data display portion 30 displaying the extracted information on the layout of the printed-wiring board, and the design data display portion 36 of the data display portion 30 displays the extracted information.

Accordingly, "information for specifying a connecting part" of the connecting part to be operated in an inspection of a printed-wiring board can be clearly defined, so that generations of miss-operation and operation inability state can be further prevented. In addition, a working time can be further reduced by further shortening the time for searching "information for specifying a component" of the component to be worked or "information for specifying an assembling part" of the assembling part to be worked; thus, workability can be further improved.

Furthermore, in the operation-related information display system 1 of the present embodiment, the data collecting portion 20 collects the target product design data in which "information for specifying a component" of the component constructing the printed-wiring board, "information for specifying an assembling part" of the printed-wiring board and "information for specifying a connecting part" of the printed-wiring board are compared with "information for indicating a layout position" of the printed-wiring board from the design data of the printed-wiring board stored in the data base portion 10, the identification factor extracting portion 32 of the data display portion 30 extracts the assembling part identification factor and connecting part identification factor corresponding to the input information from the target product design data collected by the data collecting portion 20 when voluntary "information for specifying a component", "information for specifying an assembling part", "information for specifying a connecting part" or "combination information" of these information is input from the extraction design data input portion 31 of the data display portion 30 displaying all components and connecting parts on the layout of the printed-wiring board, and the position display portion 33 of the data display portion 30 displays all components and connecting parts on the layout of the printed-wiring board with the state that the component and connecting part corresponding to the extracted identification factors are distinguished from other components and connecting parts.

Accordingly, a position to be worked in operations of assembling, inspection and repairing of a printed-wiring board can be further defined, so that generations of miss-operation and operation inability state can be further prevented. In addition, a working time can be further reduced by further shortening a time for finding a working position; thus, workability can be further improved.

Moreover, in the operation-related information display system 1 of the present embodiment, the target product design data collecting portion 23 of the data collecting portion 20 collects the target product design data in which "information for specifying a component" of the component constructing the printed-wiring board, "information for specifying an assembling part" of the printed-wiring board and "information for specifying a connecting part" of the printed-wiring board are compared with "information for indicating a layout position" of the printed-wiring board from the design data of the data base portion 10, and the target product design data input/output portion 21 inputs assembling information indicating whether or not a component is assembled when performing an assembling operation to the target product design data; and when voluntary "information for specifying a component", "information for specifying an assembling part", "information for specifying a connecting part", or "combination information" of these information is input from the extraction design data input portion 31 of the data display portion 30 displaying all components and connecting parts on the layout of the printed-wiring board, the identification factor extracting portion 32 of the data display portion 30 checks whether or not the component corresponding to the information input from the extraction design data input portion 31 based on the target product design data containing the assembling information of the data collecting portion 20 is assembled, and when the component is assembled, the identification factor extracting portion 32 of the data display portion 30 extracts the assembling part identification factor of the component and when the component is not assembled, the identification factor extracting portion 32 of the data display portion 30 extracts the connecting part identification factor of the component, and then the position display portion 33 displays all components and connecting parts on the layout of the printed-wiring board with the state that the component and connecting part corresponding to the identification factor extracted by the identification factor extracting portion 32 is discriminated from other components and connecting parts.

Therefore, a position to be worked in operations of assembling, inspection and repairing of a printed-wiring board can be further defined, so that generations of miss-operation and operation inability state can be further prevented. In addition, a working time can be further reduced by further shortening a time for finding a working position; thus, workability can be further improved.

As described above, the invention made by the present inventors was specifically described based on the preferred embodiment. However, the present invention is not limited to the above. It will be apparent those skilled in the art that various modifications and variations can be made to the structure of the present invention without departing from the scope of the invention.

The present invention can be applied to an operation-related information display method and operation-related information display system for improving workability by displaying positions of operations such as installing, confirming, exchanging and repairing of a component in assembly, inspection, repair and the like of a component of a printed-wiring board voluntarily or in accordance with an operation.

What is claimed is:

1. An operation-related information display method, comprising:
    identifying a printed-wiring board based on previously stored information for identifying the printed wiring board;
    obtaining the previously stored information related to the identified printed-wiring board; and
    displaying, on a display screen, an interface which includes a first area having a depiction of a physical layout of components of the printed-wiring board and which is configured so that a user can select a component shown on the first area and the interface will display information of at least identification information of the component and information of a type of assembly the component makes with the printed-wiring board, and a second area which is configured so a user can enter, in the second area, information of at least identification information of the component and information of a type of assembly the component makes with the printed-wiring board, wherein entering the information in the second area causes the component to be identified in the display of the first area by displaying the specified component in a manner that discriminates the specified component over the rest of the components.

2. An operation-related information display method for displaying information related to a working position of a component in operations including assembly, inspection and repair of the component of a printed wiring board, comprising:

preparing target product design data in which information for specifying a component constructing the printed-wiring board and information of a type of assembly the component makes with the printed-wiring board are compared with information for indicating a layout position of the printed-wiring board;

displaying, on a display screen, an interface which includes a first area having a depiction of a physical layout of components of the printed-wiring board and which is configured so that a user can select a component shown on the first area and the interface will display information of at least identification information of the component and information of a type of assembly the component makes with the printed-wiring board, and a second area which is configured so a user can enter, in the second area, information of at least identification information of the component and information of a type of assembly the component makes with the printed-wiring board, wherein entering the information in the second area causes the component to be identified in the display of the first area by displaying the specified component in a manner that discriminates the specified component over the rest of the components; and when a user inputs the information for specifying a component and information for specifying a type of assembly the component makes with the printed-wiring board or a combination thereof, displaying the specified component by displaying all components as a depiction of a physical layout of the printed-wiring board while displaying the specified component in a manner that discriminates the specified component over the rest of the components.

3. An operation-related information display method for displaying information related to a working position of a component in operations including assembly, inspection and repair of the component of a printed wiring board, comprising:

preparing target product design data in which information for specifying a component constructing the printed-wiring board and information of a type of assembly the component makes with the printed-wiring board are compared with information for indicating a layout position of the printed-wiring board;

displaying, on a display screen, an interface which includes a first area having a depiction of a physical layout of components of the printed-wiring board and which is configured so that a user can select a component shown on the first area and the interface will display information of at least identification information of the component and information of a type of assembly the component makes with the printed-wiring board, and a second area which is configured so a user can enter, in the second area, information of at least identification information of the component and information of a type of assembly the component makes with the printed-wiring board, wherein entering the information in the second area causes the component to be identified in the display of the first area by displaying the specified component in a manner that discriminates the specified component over the rest of the components; and when a user inputs a designated position of the component shown on the first area displaying the information of at least identification information of the component and the information of a type of assembly the component makes with the printed-wiring board.

4. An operation-related information display method for displaying information related to a working position of a component in operations including assembly, inspection and repair of the component of a printed wiring board, comprising:

preparing target product design data in which information for specifying a component constructing the printed-wiring board, information of a type of assembly the component makes with the printed-wiring board and information for specifying a connecting part of the printed-wiring board are compared with information for indicating a layout position of the printed-wiring board;

displaying, on a display screen, an interface which includes a first area having a depiction of a physical layout of components of the printed-wiring board and which is configured so that a user can select a component shown on the first area and the interface will display information of at least identification information of the component and information of a type of assembly the component makes with the printed-wiring board, and a second area which is configured so a user can enter, in the second area, information of at least identification information of the component and information of a type of assembly the component makes with the printed-wiring board, wherein entering the information in the second area causes the component to be identified in the display of the first area by displaying the specified component in a manner that discriminates the specified component over the rest of the components; and when a user inputs the identification information of the component, information of a type of assembly the component makes with the printed-wiring board, and information for specifying a connecting part or a combination thereof, displaying the specified connecting part by displaying all connecting parts of the printed-wiring board as a depiction of a physical layout of the printed-wiring board while displaying the specified connecting part in a manner that discriminates the specified connecting part over the rest of the connecting parts.

5. An operation-related information display method for displaying information related to a working position of a component in operations including assembly, inspection and repair of the component of a printed wiring board, comprising:

preparing target product design data in which information for specifying a component constructing the printed-wiring board, information of a type of assembly the component makes with the printed-wiring board and information for specifying a connecting part of the printed-wiring board are compared with information for indicating a layout position of the printed-wiring board;

displaying, on a display screen, an interface which includes a first area having a depiction of a physical layout of components of the printed-wiring board and which is configured so that a user can select a component shown on the first area and the interface will display information of at least identification information of the component and information of a type of assembly the component makes with the printed-wiring board, and a second area which is configured so a user can enter, in the second area, information of at least identification information of the component and information of a type of assembly the component makes with the printed-wiring board, wherein entering the information in the second area causes the component to be identified in the display of the first area by displaying the specified component in a manner that discriminates the specified component over the rest of the components; and when a user inputs a designated position on the first area displaying identification information of the component, information of a type of assembly the component makes with the printed-wiring board, or information of the connecting part existing in the designated position based on the target product design data.

6. An operation-related information display method for displaying information related to a working position of a component in operations including assembly, inspection and repair of the component of a printed wiring board, comprising:

preparing target product design data in which information for specifying a component constructing the printed-wiring board, information of a type of assembly the component makes with the printed-wiring board and information for specifying a connecting part of the printed-wiring board are compared with information for indicating a layout position of the printed-wiring board;

displaying, on a display screen, an interface which includes a first area having a depiction of a physical layout of components of the printed-wiring board and which is configured so that a user can select a component shown on the first area and the interface will display information of at least identification information of the component and information of a type of assembly the component makes with the printed-wiring board, and a second area which is configured so a user can enter, in the second area, information of at least identification information of the component and information of a type of assembly the component makes with the printed-wiring board, wherein entering the information in the second area causes the component to be identified in the display of the first area by displaying the specified component in a manner that discriminates the specified component over the rest of the components; and when a user inputs designated information of the identification information of the component, information of a type of assembly the component makes with the printed-wiring board information for specifying a connecting part or a combination thereof, displaying all components and connecting parts of the printed-wiring board as a depiction of a physical layout of the printed-wiring board while displaying the component, assembling part, and/or connecting part corresponding to the designated information in a manner that discriminates the component, assembling part, and/or connecting part corresponding to the designated information over the rest of the components based on the target product design data.

7. An operation-related information display method for displaying information related to a working position of a component in operations including assembly, inspection and repair of the component of a printed wiring board, comprising:

preparing target product design data in which information for specifying a component of the component constructing the printed-wiring board, information of a type of assembly the component makes with the printed-wiring board and information for the printed-wiring board are compared with information for indicating a layout position of the printed-wiring board, and assembling information for indicating whether or not a component is assembled when performing an assembling operation is compared;

displaying, on a display screen, an interface which includes a first area having a depiction of a physical layout of components of the printed-wiring board and which is configured so that a user can select a component shown on the first area and the interface will display information of at least identification information of the component and information of a type of assembly the component makes with the printed-wiring board, and a second area which is configured so a user can enter, in the second area, information of at least identification information of the component and information of a type of assembly the component makes with the printed-wiring board, wherein entering the information in the second area causes the component to be identified in the display of the first area by displaying the specified component in a manner that discriminates the specified component over the rest of the components; and when a user inputs designated information of the identification information of the component, information of a type of assembly the component makes with the printed-wiring board, information for specifying a connecting part or a combination thereof, checking whether or not a component corresponding to the designated information is assembled based on the target product design data;

when the component of the designated information is assembled, displaying all components and connecting parts of the printed-wiring board as a depiction of a physical layout of the printed-wiring board while displaying the component of the designated information in a manner that discriminates the component of the designated information over the rest of the components; and when the component of the designated information is not assembled, displaying all components and connecting parts of the printed-wiring board as a depiction of a physical layout of the printed-wiring board while displaying the connecting part of the designated information in a manner that discriminates the connecting part of the designated information over the rest of the components.

8. An operation-related information display system for displaying information related to a working position of a component in operations including assembly, inspection and repair of the component of a printed-wiring board, comprising:

a data base device configured to store design data of the printed-wiring board;

a data collecting device configured to collect target product design data in which information for specifying a component constructing the printed-wiring board and information of a type of assembly the component makes with the printed-wiring board are compared with information for indicating a layout position of the printed-wiring board from the design data of the data base device; and a data display device configured to display all components on a layout of the printed-wiring board, wherein the data display device is configured to display, on an interface, a first area having a depiction of a physical layout of components of the printed-wiring board and which is configured so that a user can select a component shown on the first area and the interface will display information of at least identification information of the component and information of a type of assembly the component makes with the printed-wiring board, and a second area which is configured so a user can enter, in the second area, information of at least identification information of the component and information of a type of assembly the component makes with the printed-wiring board, wherein entering the information in the second area causes the component to be identified in the display of the first area by displaying the specified component in a manner that discriminates the specified component over the rest of the components.

9. An operation-related information display system for displaying information related to a working position of a component in operations including assembly, inspection and repair of the component of a printed-wiring board, comprising:
- a data base device configured to store design data of the printed-wiring board;
- a data collecting device configured to collect target product design data in which information for specifying a component constructing the printed-wiring board, information of a type of assembly the component makes with the printed-wiring board and information for specifying a connecting part of the printed-wiring board are compared with information for indicating a layout position of the printed-wiring board from the design data of the data base device; and
- a data display device configured to display all connecting parts on a layout of the printed-wiring board, the data display device is configured to display, on an interface, a first area having a depiction of a physical layout of components of the printed-wiring board and which is configured so that a user can select a component shown on the first area and the interface will display information of at least identification information of the component and information of a type of assembly the component makes with the printed-wiring board, and a second area which is configured so a user can enter, in the second area, information of at least identification information of the component and information of a type of assembly the component makes with the printed-wiring board, wherein entering the information in the second area causes the component to be identified in the display of the first area by displaying the specified component in a manner that discriminates the specified component over the rest of the components,
- wherein the data display device includes an identification factor extracting device configured to extract an assembling part identification factor and connecting part identification factor corresponding to the information input into the second area from the target product design data collected by the data collecting device, and the first area displays all connecting parts as a depiction of a physical layout of the printed-wiring board while displaying the the connecting part corresponding to the identification factor extracted by the identification factor extracting device in a manner that discriminates the connecting part corresponding to the identification factor over the rest of the connecting parts.

10. An operation-related information display system for displaying information related to a working position of a component in operations including assembly, inspection and repair of the component of a printed-wiring board, comprising:
- a data base device configured to store design data of the printed-wiring board;
- a data collecting device configured to collect target product design data in which information for specifying a component of the component constructing the printed-wiring board, information of a type of assembly the component makes with the printed-wiring board and information for specifying a connecting part of the printed-wiring board are compared with information for indicating a layout position of the printed-wiring board from the design data of the data base device and
- a data display device configured to display extracted information, the data display device is configured to display, on an interface, a first area having a depiction of a physical layout of components of the printed-wiring board and which is configured so that a user can select a component shown on the first area and the interface will display information of at least identification information of the component and information of a type of assembly the component makes with the printed-wiring board, and a second area which is configured so a user can enter, in the second area, information of at least identification information of the component and information of a type of assembly the component makes with the printed-wiring board, wherein entering the information in the second area causes the component to be identified in the display of the first area by displaying the specified component in a manner that discriminates the specified component over the rest of the components,
- wherein the data display device includes a design data extracting device configured to extract information for specifying a component existing in the position input into the first area, information of a type of assembly the component makes with the printed wiring board existing in the input position or information for specifying a connecting part existing in the input position from the target product design data collected by the data collecting device and a design data display device configured to display the information extracted by the design data extracting device.

11. An operation-related information display system for displaying information related to a working position of a component in operations including assembly, inspection and repair of the component of a printed-wiring board, comprising:
- a data base device configured to store design data of the printed-wiring board;
- a data collecting device configured to collect target product design data in which information for specifying a component constructing the printed-wiring board, information of a type of assembly the component makes with the printed-wiring board and information for specifying a connecting part of the printed-wiring board are compared with information for indicating a layout position of the printed-wiring board from the design data of the data base device; and
- a data display device configured to display all components and connecting parts on a layout of the printed-wiring board, the data display device is configured to display, on an interface, a first area having a depiction of a physical layout of components of the printed-wiring board and which is configured so that a user can select a component shown on the first area and the interface will display information of at least identification information of the component and information of a type of assembly the component makes with the printed-wiring board, and a second area which is configured so a user can enter, in the second area, information of at least identification information of the component and information of a type of assembly the component makes with the printed-wiring board, wherein entering the information in the second area causes the component to be identified in the display of the first area by displaying the specified component in a manner that discriminates the specified component over the rest of the components, wherein the data display device includes an identification factor extracting device configured to extract an assembling part identification factor and connecting part identification factor corresponding to the information input in the second area from the target product design data collected by the data collecting device and the first area displays all components and connecting parts as a depiction of a physical layout of the printed-wiring board while displaying the component and connecting part corresponding to the identification factor extracted by the identification factor extracting device in a manner that discriminates the connecting part corresponding to the identification factor over the rest of the components.

12. An operation-related information display system for displaying information related to a working position of a component in operations including assembly, inspection and repair of the component of a printed-wiring board, comprising:

a data base device configured to store design data of the printed-wiring board;

a data collecting device configured to collect target product design data from the data base device; and a data display device configured to display all components and connecting parts on a layout of the printed-wiring board, the data display device is configured to display, on an interface, a first area having a depiction of a physical layout of components of the printed-wiring board and which is configured so that a user can select a component shown on the first area and the interface will display information of at least identification information of the component and information of a type of assembly the component makes with the printed-wiring board, and a second area which is configured so a user can enter, in the second area, information of at least identification information of the component and information of a type of assembly the component makes with the printed-wiring board, wherein entering the information in the second area causes the component to be identified in the display of the first area by displaying the specified component in a manner that discriminates the specified component over the rest of the components, wherein the data collecting device includes a target product design data collecting device configured to collect target product design data in which information for specifying a component constructing the printed-wiring board, information a type of assembly the component makes with the printed-wiring board and information for specifying a connecting part of the printed-wiring board are compared with information for indicating a layout position of the printed-wiring board from the design data of the data base device and an target product design data input device configured to input assembling information for indicating whether or not a component is assembled when performing an assembling operation to the target product design data; and the data display device includes an identification factor extracting device configured to check whether or not the component corresponding to the information input in the second area is assembled based on the target product design data including the assembling information of the data collecting device, to extract the assembling part identification factor of the component when the component is assembled, and to extract the connecting part identification factor of the component when the component is not assembled, and the first area displays all components and connecting parts as a depiction of a physical layout of the printed-wiring board while displaying the component and connecting part corresponding to the identification factor extracted by the identification factor extracting device in a manner that discriminates the component and connecting part corresponding to the identification factor over the rest of the components.

13. A printed-wiring board operation-related information display system including a data base portion in which information for identifying a printed-wiring board and information related to the printed-wiring board are stored and a display portion capable of displaying a layout of the printed-wiring board and the information related to the identified printed-wiring board identified by the information for identifying the printed-wiring board, comprising:

a information display device configured to display, on an interface, a first area having a depiction of a physical layout of components of the printed-wiring board and which is configured so that a user can select a component shown on the first area and the interface will display information of at least identification information of the component and information of a type of assembly the component makes with the printed-wiring board, and a second area which is configured so a user can enter in the second area information of at least identification information of the component and information of a type of assembly the component makes with the printed-wiring board, wherein entering the information in the second area causes the component to be identified in the display of the first area by displaying the specified component in a manner that discriminates the specified component over the rest of the components.

14. The printed-wiring board operation-related information display system according to claim 13, wherein the information display device provides the display corresponding to user inputted information in distinction from a provided display corresponding to non-user inputted information.

15. The printed-wiring board operation-related information display system according to claim 14, wherein the information display device distinguishes between the provided display corresponding to the user inputted information and a provided display corresponding to the non-user inputted information by a color.

16. The printed-wiring board operation-related information display system according to claim 13, wherein the information related to the printed-wiring board is at least one of information for specifying a component to be installed onto the printed-wiring board, information for specifying an assembling part related to the component to be installed onto the printed-wiring board, information for specifying a connecting part related to the component to be installed onto the printed wiring board and information for indicating a layout position of the printed-wiring board corresponding to the information for specifying a component, information for specifying an assembling part and information for specifying a connecting part.

17. The printed-wiring board operation-related information display system according to claim 14, wherein the information related to the printed-wiring board is at least one of information for specifying a component to be installed onto the printed-wiring board, information for specifying an assembling part related to the component to be installed onto the printed-wiring board, information for specifying a connecting part related to the component to be installed onto the printed-wiring board and information for indicating a layout position of the printed-wiring board corresponding to the information for specifying a component, information for specifying an assembling part and information for specifying a connecting part.

18. The printed-wiring board operation-related information display system according to claim 15, wherein the information related to the printed-wiring board is at least one of information for specifying a component to be installed onto the printed-wiring board, information for specifying an assembling part related to the component to be installed onto the printed-wiring board, information for specifying a connecting part related to the component to be installed onto the printed-wiring board and information for indicating a layout position of the printed-wiring board corresponding to the information for specifying a component, information for specifying an assembling part and information for specifying a connecting part.

19. A printed-wiring board operation-related information display method, comprising:
storing information for identifying a printed-wiring board and information related to the printed-wiring board;
identifying the printed-wiring board;
obtaining information related to the identified printed-wiring board; and
displaying, on a display screen, an interface which includes a first area having a depiction of a physical layout of components of the printed-wiring board and which is configured so that a user can select a component shown on the first area and the interface will display information of at least identification information of the component and information of a type of assembly the component makes with the printed-wiring board, and a second area which is configured so a user can enter in the second area information of at least identification information of the component and information of a type of assembly the component makes with the printed-wiring board, wherein entering the information in the second area causes the component to be identified in the display of the first area by displaying the specified component in a manner that discriminates the specified component over the rest of the components.

20. The printed-wiring board operation-related information display method according to claim 19, wherein the provided display corresponding to the user inputted information is displayed in distinction from a provided display corresponding to non-user inputted information.

21. A printed circuit assembly manufacturing method, comprising:
storing information for identifying a printed-wiring board and information related to the printed-wiring board;
identifying the printed-wiring board;
obtaining information related to the identified printed-wiring board;
displaying, on a display screen, an interface which includes a first area having a depiction of a physical layout of components of the printed-wiring board and which is configured so that a user can select a component shown on the first area and the interface will display information of at least identification information of the component and information of a type of assembly the component makes with the printed-wiring board, and a second area which is configured so a user can enter in the second area information of at least identification information of the component and information of a type of assembly the component makes with the printed-wiring board, wherein entering the information in the second area causes the component to be identified in the display of the first area by displaying the specified component in a manner that discriminates the specified component over the rest of the components; and
mounting a component on the printed wiring board and inspecting the printed-wiring board based on the display corresponding to the user inputted information into the second area.

22. A printed circuit assembly manufacturing method, comprising:
storing information for identifying a printed-wiring board and information related to the printed-wiring board;
identifying the printed-wiring board;
obtaining information related to the identified printed-wiring board;
displaying, on a display screen, an interface which includes a first area having a depiction of a physical layout of components of the printed-wiring board and which is configured so that a user can select a component shown on the first area and the interface will display information of at least identification information of the component and information of a type of assembly the component makes with the printed-wiring board, and a second area which is configured so a user can enter in the second area information of at least identification information of the component and information of a type of assembly the component makes with the printed-wiring board, wherein entering the information in the second area causes the component to be identified in the display of the first area by displaying the specified component in a manner that discriminates the specified component over the rest of the components; and
mounting a component on the printed wiring board and inspecting the printed-wiring board based on the display of the information corresponding to the displayed component in the first area.

23. A printed circuit assembly manufacturing method, comprising:
storing information for identifying a printed-wiring board and information related to the printed-wiring board;
identifying the printed-wiring board;
obtaining information related to the identified printed-wiring board;
displaying, on a display screen, an interface which includes a first area having a depiction of a physical layout of components of the printed-wiring board and which is configured so that a user can select a component shown on the first area and the interface will display information of at least identification information of the component and information of a type of assembly the component makes with the printed-wiring board, and a second area which is configured so a user can enter in the second area information of at least identification information of the component and information of a type of assembly the component makes with the printed-wiring board to cause the component to be displayed by displaying the specified component in a manner that discriminates the specified component over the rest of the components; and
mounting a component on the printed-wiring board and inspecting the printed-wiring board based on the provided display corresponding to the user inputted information into the second area and the display of the information corresponding to the displayed component in the first area.

24. A computer readable storage medium encoded with computer executable instructions, which when executed by a computer, which has a data base in which information for identifying a printed-wiring board and information related to the printed-wiring board are stored, or is capable of connecting with the data base and is connected to a display device for conducting a display of a layout of the printed-wiring board, cause the computer to perform a method comprising:

identifying the printed-wiring board;

obtaining information related to the identified printed-wiring board; and displaying, on a display screen, an interface which includes a first area having a depiction of a physical layout of components of the printed-wiring board and which is configured so that a user can select a component shown on the first area and the interface will display information of at least identification information of the component and information of a type of assembly the component makes with the printed-wiring board, and a second area which is configured so a user can enter in the second area information of at least identification information of the component and information of a type of assembly the component makes with the printed-wiring board to cause the component to be displayed by displaying the specified component in a manner that discriminates the specified component over the rest of the components.

* * * * *